(12) United States Patent
Huang (10) Patent No.: US 11,733,310 B2
(45) Date of Patent: Aug. 22, 2023

(54) INSULATION RESISTANCE DETECTION DEVICE AND FORKLIFT TRUCK

(71) Applicant: RoyPow Technology Co., Ltd., Guangdong (CN)

(72) Inventor: Meng Huang, Huizhou (CN)

(73) Assignee: RoyPow Technology Co, Ltd., Huizhou (CN)

( * ) Notice: Subject to any disclaimer, the term of this patent is extended or adjusted under 35 U.S.C. 154(b) by 0 days.

(21) Appl. No.: 17/559,250

(22) Filed: Dec. 22, 2021

(65) Prior Publication Data

US 2023/0080813 A1 Mar. 16, 2023

(30) Foreign Application Priority Data

Sep. 16, 2021 (CN) .......................... 202111089275.3

(51) Int. Cl.
| | |
|---|---|
| *G01R 31/3835* | (2019.01) |
| *G01R 31/389* | (2019.01) |
| *B66F 9/075* | (2006.01) |
| *G08B 21/18* | (2006.01) |

(52) U.S. Cl.
CPC .......... *G01R 31/3835* (2019.01); *B66F 9/075* (2013.01); *G01R 31/389* (2019.01); *G08B 21/182* (2013.01)

(58) Field of Classification Search
CPC ... G01R 31/3835; G01R 31/389; B66F 9/075; G08B 21/182
USPC ...................................................... 340/660
See application file for complete search history.

(56) References Cited

U.S. PATENT DOCUMENTS

| | | | | |
|---|---|---|---|---|
| 9,261,540 | B2* | 2/2016 | Tu .......................... | G01R 17/00 |
| 10,895,593 | B2* | 1/2021 | Zhang .................. | G01R 31/389 |
| 11,085,960 | B2* | 8/2021 | Chu .................... | G01R 31/3835 |
| 11,193,981 | B2* | 12/2021 | Kim ....................... | G01R 27/08 |
| 2007/0090801 | A1* | 4/2007 | Kim .................... | G01R 31/3835 |
| | | | | 320/128 |

(Continued)

FOREIGN PATENT DOCUMENTS

| | | |
|---|---|---|
| CN | 106405249 A | 2/2017 |
| CN | 107728066 A | 2/2018 |

(Continued)

OTHER PUBLICATIONS

Chinese Patent Office: Office Action of CN 202111089275.3 (related application); dated May 7, 2022; 8 pages.

*Primary Examiner* — Zhen Y Wu (57) ABSTRACT

The disclosure relates to an insulation resistance detection device and a forklift truck. The insulation resistance detection device includes a detection module, a voltage conditioning module, and a control module. The device uses a first voltage dividing unit and a second voltage dividing unit to replace the inverting amplifier circuit, to obtain a positive voltage corresponding to the voltage of the negative electrode of the battery to be detected with respect to the first reference ground, thereby reducing costs of the insulation resistance detection device. The control module calculates the first insulation resistance of the positive electrode of the battery to be detected with respect to the first reference ground and the second insulation resistance of the negative electrode of the battery to be detected with respect to the first reference ground according to the first voltage and the third voltage.

8 Claims, 7 Drawing Sheets

(56) References Cited

U.S. PATENT DOCUMENTS

| | | | | |
|---|---|---|---|---|
| 2010/0225326 A1* | 9/2010 | Wang | ............ | G01R 31/3835 |
| | | | | 324/427 |
| 2011/0115490 A1* | 5/2011 | Klijn | ............ | G01R 31/3835 |
| | | | | 324/433 |
| 2012/0016613 A1* | 1/2012 | Yang | ............ | G01R 27/16 |
| | | | | 702/65 |
| 2012/0295669 A1* | 11/2012 | Zhou | ............ | G01R 31/3835 |
| | | | | 455/572 |
| 2017/0016951 A1* | 1/2017 | Sung | ............ | G01R 31/389 |
| 2019/0011504 A1* | 1/2019 | Kim | ............ | G01R 27/14 |
| 2019/0064279 A1* | 2/2019 | Dan | ............ | G01R 31/389 |
| 2019/0237815 A1* | 8/2019 | Dan | ............ | G02B 6/0078 |
| 2020/0225275 A1* | 7/2020 | Du | ............ | G01R 31/006 |
| 2021/0231742 A1* | 7/2021 | Li | ............ | G01R 31/14 |
| 2022/0003823 A1* | 1/2022 | Lee | ............ | G01R 31/3842 |

FOREIGN PATENT DOCUMENTS

| | | |
|---|---|---|
| CN | 108196171 A | 6/2018 |
| CN | 110967560 A | 4/2020 |
| CN | 110967606 A | 4/2020 |
| CN | 110967607 A | 4/2020 |
| CN | 213780273 U | 7/2021 |

* cited by examiner

INSULATION RESISTANCE DETECTION DEVICE AND FORKLIFT TRUCK

CROSS-REFERENCE TO RELATED APPLICATIONS

The present application claims priority to Chinese Patent Application No. 202111089275.3, filed on Sep. 16, 2021, and entitled INSULATION RESISTANCE DETECTION METHOD FOR FORKLIFT TRUCK, the specification of which is incorporated by reference herein in its entirety.

TECHNICAL FIELD

The present disclosure relates to the field of battery insulation resistance detection technology, and particularly to an insulation resistance detection device and a forklift truck.

BACKGROUND

For vehicles that use batteries as a source of power, since the environment in which the vehicle is used and the use of the battery may cause the battery itself or the connection lines between them to age and other reasons, insulation problems between the vehicle battery and the vehicle chassis may be caused. At present, the battery voltage of the vehicle as a power source usually exceeds the safe voltage range, then an insulation resistance detection should be carried out to detect battery leakage in order to reduce safety risks.

SUMMARY

In view of this, it is necessary to provide an insulation resistance detection device and a forklift truck capable of reducing safety risks.

In the first aspect, an insulation resistance detection device is provided, including:

a detection module, configured to connect a battery to be detected, to detect a voltage of a positive electrode of the battery to be detected with respect to a first reference ground and output a corresponding first voltage, and detect a voltage of a negative electrode of the battery to be detected with respect to the first reference ground and output a corresponding second voltage; a voltage conditioning module, including a first voltage dividing unit and a second voltage dividing unit, wherein a first end of the first voltage dividing unit is connected to a first end of the second voltage dividing unit, a second end of the first voltage dividing unit is connected to the detection module to acquire the second voltage, and a second end of the second voltage dividing unit is configured to connect a reference voltage to make a third voltage be a positive voltage with respect to the first reference ground, wherein the third voltage is a voltage at the first end of the first voltage dividing unit; a control module, respectively connected to a sampling module and the first end of the first voltage dividing unit, and configured to acquire the first voltage and the third voltage and calculate a first insulation resistance of the positive electrode of the battery to be detected with respect to the first reference ground and a second insulation resistance of the negative electrode of the battery to be detected with respect to the first reference ground according to the first voltage and the third voltage.

In an embodiment, the voltage conditioning module further includes a third voltage dividing unit and a fourth voltage dividing unit, a first end of the third voltage dividing unit is connected to the first reference ground, a second end of the third voltage dividing unit is respectively connected to a first end of the fourth voltage dividing unit and the control module, a second end of the fourth voltage dividing unit is configured to connect the reference voltage; the control module is connected to the second end of the third voltage dividing unit, and the control module is further configured to calculate the first insulation resistance of the positive electrode of the battery to be detected with respect to the first reference ground and the second insulation resistance of the negative electrode of the battery to be detected with respect to the first reference ground according to the first voltage, the third voltage, and a fourth voltage; wherein the fourth voltage is a voltage at the second end of the third voltage dividing unit.

In an embodiment, the insulation resistance detection device further includes a filter follower module, wherein the filter follower module includes a first filter unit and a first follower unit, the first filter unit is electrically connected to the sampling module to acquire the first voltage, and the first follower unit is respectively connected to the first filter unit and the control module; and/or the filter follower module further includes a second filter unit and a second follower unit, the second filter unit is respectively connected to the sampling module to acquire the second voltage, and the second follower unit is respectively connected to the second filter unit and the second end of the first voltage dividing unit.

In an embodiment, the first follower unit includes a first operational amplifier, and a positive phase input end of the first operational amplifier is connected to the first filter unit, a negative phase input end of the first operational amplifier is connected to an output end of the first operational amplifier, the output end of the first operational amplifier is connected to the control module, a positive power supply end of the first operational amplifier is configured to connect the reference voltage, a negative power supply end of the first operational amplifier is configured to connect a negative reference voltage, the negative reference voltage and the reference voltage are equal in magnitude but opposite in direction; and/or, the second follower unit includes a second operational amplifier, a positive phase input end of the second operational amplifier is connected to the second filter unit, a negative phase input end of the second operational amplifier is connected to an output end of the second operational amplifier, the output end of the second operational amplifier is connected to the second end of the first voltage dividing unit, a positive power supply end of the second operational amplifier is configured to connect the reference voltage, a negative power supply end of the second operational amplifier is configured to connect the negative reference voltage.

In an embodiment, the negative electrode of the battery to be detected is connected to a second reference ground, and the insulation resistance detection device further includes: a power supply module, connected to the positive electrode of the battery to be detected, wherein a ground end of the power supply module is configured to connect the second reference ground to adjust a voltage of the battery to be detected to a fifth voltage; an isolation power supply module, respectively connected to the power supply module, the positive power supply end of the second operational amplifier, and the negative power supply end of the second operational amplifier, wherein a ground end of the isolation power supply module is configured to connect the first reference ground, the isolation power supply module is configured to adjust the fifth voltage to the reference voltage and a negative reference voltage.

In an embodiment, the sampling module includes: a fifth voltage dividing unit, including a first sampling resistor and a first voltage dividing resistor, wherein a first end of the first sampling resistor is configured to connect the first reference ground, a second end of the first sampling resistor is respectively connected to the first filter unit and a first end of the first voltage dividing resistor, and a second end of the first voltage dividing resistor is configured to connect the positive electrode of the battery to be detected; a sixth voltage dividing unit, including a second sampling resistor and a second voltage dividing resistor, wherein a first end of the second sampling resistor is configured to connect the first reference ground, a second end of the second sampling resistor is respectively connected to the second filter unit and a first end of the second voltage dividing resistor, a second end of the second voltage dividing resistor is configured to connect to the negative electrode of the battery to be detected; a first switch unit, configured to turn on or turn off a first power supply circuit, wherein the first power supply circuit is a circuit formed by the fifth voltage dividing unit and the battery to be detected; a second switch unit, configured to turn on or turn off a second power supply circuit, wherein the second power supply circuit is a circuit formed by the sixth voltage dividing unit and the battery to be detected.

In an embodiment, the control module includes: an analog-to-digital conversion unit, respectively connected to the sampling module and the first end of the first voltage dividing unit, and configured to convert the first voltage into a first digital signal and the third voltage into a second digital signal; an isolation communication unit, connected to the analog-to-digital conversion unit; a control unit, connected to the isolation communication unit, and configured to acquire the first digital signal and the second digital signal and calculate the first insulation resistance of the positive electrode of the battery to de detected with respect to the first reference ground and the second insulation resistance of the negative electrode of the battery to be detected with respect to the first reference ground according to the first digital signal and the second digital signal.

In an embodiment, the control module is further configured to output alarm information according to the first insulation resistance, the second insulation resistance and a threshold insulation resistance; the insulation resistance detection device further includes an alarm module connected to the control module and configured to receive the alarm information and perform an alarm operation corresponding to the alarm information.

In an embodiment, the battery to be detected is a forklift truck battery, and the first reference ground is a forklift truck body.

In the second aspect, a forklift truck is provided, including the insulation resistance detection device according to any one of claims 1 to 8, wherein the detection module is connected to a forklift truck battery.

The above-mentioned insulation resistance detection device includes a detection module, a voltage conditioning module, and a control module. The voltage conditioning module can convert the second voltage, output by the detection module and corresponding to the voltage of the negative electrode of the battery to be detected with respect to the first reference ground, into the corresponding positive voltage, i.e., the third voltage. The control module acquires the first voltage and the third voltage corresponding to the voltage of the positive electrode of the battery to be detected with respect to the first reference ground, and calculates the first insulation resistance and the second insulation resistance according to the first voltage and the third voltage.

The voltage conditioning module includes the first voltage dividing unit and the second voltage dividing unit connected in series with each other. The second end of the second voltage dividing unit is connected to the reference voltage. According to the principle of voltage dividing, the third voltage at the first end of the first voltage dividing unit (the first end of the second voltage dividing unit) is a positive voltage; and the whole device can obtain the positive voltage corresponding to the voltage of the negative electrode of the battery to be detected with respect to the first reference ground without using an inverting amplifier circuit, thereby reducing the cost of the insulation resistance detection device. The control module calculates the first insulation resistance of the positive electrode of the battery to be detected with respect to the first reference ground and the second insulation resistance of the negative electrode of the battery to be detected with respect to the first reference ground according to the first voltage and the third voltage, to monitor the insulation state between the battery to be detected and the first reference ground and prevent the insulation failure of the battery to be detected without knowledge of the user and reduce a safety risk.

BRIEF DESCRIPTION OF THE DRAWINGS

In order to more clearly describe the technical solution of the embodiment of the present disclosure or the conventional technology, accompanying drawings that need to be used in the description of the embodiments or the conventional technology will be briefly introduced. Obviously, the drawings in the following description are merely some embodiments of the present disclosure. Those of ordinary skill in the art can also obtain other drawings based on these drawings without creative work.

DETAILED DESCRIPTION

In order to facilitate understanding of the present disclosure, the present disclosure will be described below more fully with reference to the accompanying drawings. However, the present disclosure can be implemented in various forms, and should not be construed as being limited to the embodiments set forth herein. Rather, these embodiments make the present disclosure more comprehensive and complete.

Unless otherwise defined, all technical and scientific terms used herein have the same meaning as commonly understood by those skilled in the technical field of this disclosure. The terms used in the specification of the disclosure herein is only for the purpose of describing specific embodiments, and is not intended to limit the disclosure.

It can be understood that the terms "first", "second", etc., used in this disclosure can be used herein to describe various elements, but these elements are not limited by these terms. These terms are merely utilized to distinguish the first element from another element. For example, without departing from the scope of the present disclosure, the first resistance can be referred to as the second resistance, and similarly, the second resistance can be referred to as the first resistance. Both the first resistance and the second resistance are resistances, but they are not the same resistance.

It can be understood that "connection" in the following embodiments should be understood as "electrical connection", "communication connection" and the like if the connected circuits, modules, units, etc., have electrical signals or data transmission therebetween.

When used herein, the singular forms of "a", "an" and "the" may also include plural forms, unless the context clearly indicates otherwise. It should also be understood that the terms "including/comprising" or "having" and the like designate the existence of the stated features, wholes, steps, operations, components, parts or their combinations, but do not exclude the existence or addition of possibility of one or more other features, wholes, steps, operations, components, parts or their combinations. Meanwhile, the term "and/or" used in this specification includes any and all combinations of related listed items.

Figure 1:
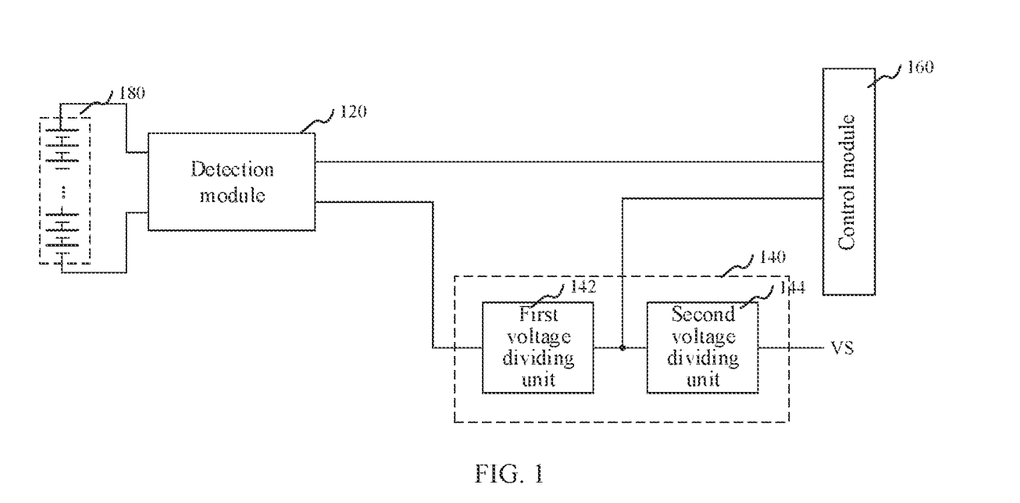
FIG. 1 is a schematic structure diagram of an insulation resistance detection device according to an embodiment I.

Referring to FIG. 1, which shows an insulation resistance detection device provided by an embodiment I of the present disclosure. The insulation resistance detection device can include a detection module 120, a voltage conditioning module 140, and a control module 160.

The detection module 120 is configured to: connect a battery 180 to be detected, detect a voltage of a positive electrode of the battery 180 to be detected with respect to a first reference ground, and output a corresponding first voltage; detect a voltage of a negative electrode of the battery 180 to be detected with respect to the first reference ground, and output a corresponding second voltage. It should be noted that in the process of detecting the battery 180 to be detected, the detection module 120 can output the first voltage and the second voltage simultaneously, or output the first voltage and the second voltage at different time, which is not limited in the embodiments of the present disclosure. It should be appreciated that the first voltage output by the detection module 120 can reflect the voltage of the positive electrode of the battery 180 to be detected relative to the first reference ground; and the second voltage output by the detection module 120 can reflect the voltage of the negative electrode of the battery 180 to be detected relative to the first reference ground. It should be noted that, the first reference ground is taken as a reference zero point (zero-level point), the first voltage is a positive voltage, and the second voltage is a negative voltage. In an embodiment, the detection module 120 can be configured to detect the voltage of the positive electrode of the battery 180 to be detected with respect to the first reference ground, divide the voltage, and output a divided first voltage; and the detection module 120 can also be configured to detect the voltage of the negative electrode of the battery 180 to be detected with respect to the first reference ground, and divide the voltage and output a divided second voltage. In an embodiment, the detection module 120 can include a first output end and a second output end. The first output end is configured to output a first voltage, and the second output end is configured to output a second voltage.

The voltage conditioning module 140 can include a first voltage dividing unit 142 and a second voltage dividing unit 144. A first end of the first voltage dividing unit 142 is connected to a first end of the second voltage dividing unit 144; and a second end of the first voltage dividing unit 142 is connected to the detection module 120 to acquire the second voltage. A second end of the second voltage dividing unit 144 is configured to connect the reference voltage VS to make a third voltage be a positive voltage with respect to the first reference ground. The third voltage is a voltage at the first end of the first voltage dividing unit 142. It can be understood that the third voltage is also a voltage at the first end of the second voltage dividing unit 144. The third voltage is a positive voltage that can reflect the voltage of the negative electrode of the battery to be detected with respect to the first reference ground.

It can be understood that the voltage at the second end of the first voltage dividing unit 142 is a negative voltage with respect to the first reference ground; under the conditioning of the ratio of the reference voltage, the resistance value of the first voltage dividing unit 142 and the resistance value of the second voltage dividing unit 144, the voltage at the first end of the first voltage dividing unit 142 can be a positive voltage with respect to the first reference ground.

In the embodiment of the present disclosure, the first voltage dividing unit 142 and the second voltage dividing unit 144 are utilized so that the control module 160 can acquire the positive voltage (third voltage) corresponding to the voltage of the negative electrode of the battery 180 to be detected with respect to the first reference ground, without using a reverse amplifying circuit to process the conversion into a positive voltage, accordingly the structure of the insulation resistance detection device is simpler and the cost is lower. Optionally, the first voltage dividing unit 142 can be a resistor R1. Optionally, the second voltage dividing unit 144 can be a resistor R2. Optionally, a resistance value of the resistor R1 is the same as that of the resistor R2.

The control module 160 is respectively connected to the sampling module and the first end of the first voltage dividing unit 142 to acquire the first voltage and the third voltage, and calculate a first insulation resistance of the positive electrode of the battery 180 to be detected with respect to the first reference ground and a second insulation resistance of the negative electrode of the battery 180 to be detected with respect to the first reference ground according to the first voltage and the third voltage. It should be understandable that since the first voltage can reflect the voltage of the first insulation resistance of the positive electrode of the battery 180 to be detected with respect to the first reference ground; the third voltage can reflect the voltage of the negative electrode of the battery 180 to be detected with respect to the first reference ground; and the first voltage and the third voltage are both positive voltages with respect to the first reference ground. The control module 160 can calculate and determine the first insulation resistance and the second insulation resistance through the first voltage and the third voltage.

The insulation resistance detection device provided by the embodiment of the present disclosure includes a detection module, a voltage conditioning module, and a control module. The voltage conditioning module can convert the second voltage, outputted by the detection module and corresponding to the voltage of the negative electrode of the battery to be detected with respect to the first reference ground, into a positive voltage, i.e., the third voltage. The control module acquires the first voltage and the third voltage corresponding to the voltage of the positive electrode of the battery to be detected with respect to the first reference ground, and calculates the first insulation resistance and the second insulation resistance according to the first voltage and the third voltage.

The voltage conditioning module includes a first voltage dividing unit and a second voltage dividing unit connected in series with each other. A second end of the second voltage dividing unit is connected to the reference voltage. According to the principle of voltage dividing, a third voltage at a first end of the first voltage dividing unit (a first end of the second voltage dividing unit) is a positive voltage. The whole device can acquire a positive voltage corresponding to the voltage of the negative electrode of the battery to be detected with respect to the first reference ground without using an inverting amplifier circuit, thereby reducing the cost of the insulation resistance detection device. The control module calculates the first insulation resistance of the positive electrode of the battery to be detected with respect to the first reference ground and the second insulation resistance of the negative electrode of the battery to be detected with respect to the first reference ground according to the first voltage and the third voltage, in order to monitor the insulation state between the battery to be detected and the first reference ground, and prevent the insulation failure of the battery to be detected without knowledge of the user and reduce a safety risk.

Figure 2:
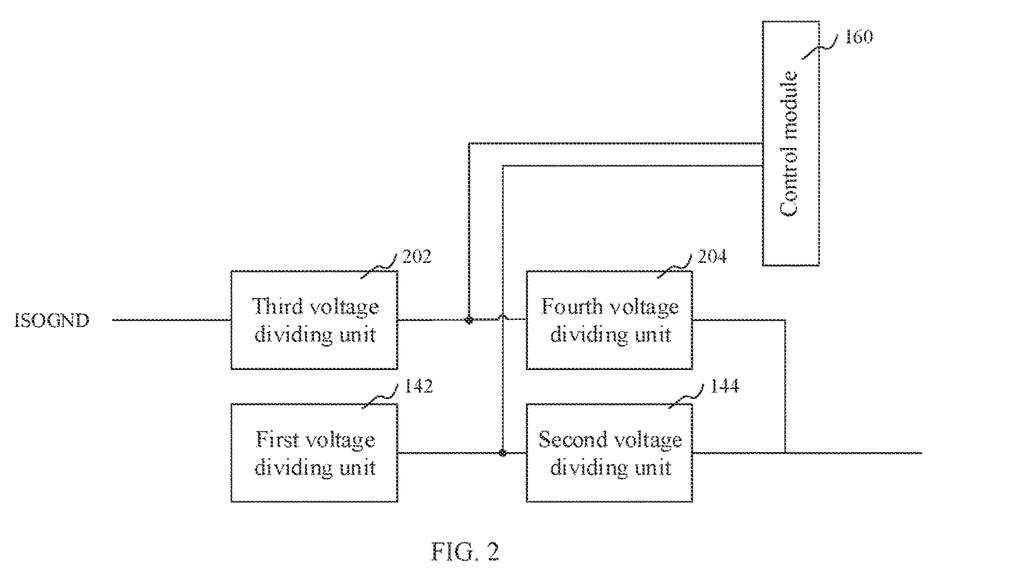
FIG. 2 is a schematic structure diagram of a voltage conditioning module according to an embodiment.

Referring to FIG. 2, which shows a voltage conditioning module provided by an embodiment of the present disclosure. The voltage conditioning module includes a first voltage dividing unit 142, a second voltage dividing unit 144, a third voltage dividing unit 202, and a fourth voltage dividing unit 204. Specifically, a first end of the third voltage dividing unit 202 is connected to the first reference ground ISOGND, and a second end of the third voltage dividing unit 202 is connected to a first end of the fourth voltage dividing unit 204 and the control module 160 respectively. A second end of the fourth voltage dividing unit 204 is configured to connect the reference voltage VS. The voltage at the second end of the third voltage dividing unit 202 is a fourth voltage. It can be understood that the voltage at the first end of the fourth voltage dividing unit 204 is also the fourth voltage. It should be noted that, for the description of the first voltage dividing unit 142 and the second voltage dividing unit 144, reference can be made to the above embodiments for details, and will not be repeated here.

The control module 160 is respectively connected to the sampling module, the second end of the first voltage dividing unit 142 and the second end of the third voltage dividing unit 202. The control module 160 can be configured to calculate the first insulation resistance of the positive electrode of the battery to be detected with respect to the first reference ground and the second insulation resistance of the negative electrode of the battery to be detected with respect to the first reference ground according to the first voltage, the third voltage and the fourth voltage.

It can be understood that, in the embodiment of the present disclosure, the first end of the third voltage dividing unit 202 is connected to the first reference ground, and the second end of the third voltage dividing unit 202 is respectively connected to the first end of the fourth voltage dividing unit 204 and the control module 160, the second end of the fourth voltage dividing unit 204 is connected to the reference voltage VS, and the reference voltage VS can be accurately acquired through the fourth voltage at the second end of the third voltage dividing unit 202, thereby avoiding errors in the calculated first insulation resistance and the second insulation resistance due to the inaccurate value of the reference voltage VS, and achieving more accurate first insulation resistance and second insulation resistance. Optionally, the third voltage dividing unit 202 can be a resistor R3. Optionally, the fourth voltage dividing unit 204 can be a resistor R4. Optionally, the resistance value of the third voltage dividing unit 202 is the same as that of the fourth voltage dividing unit.

Figure 3:
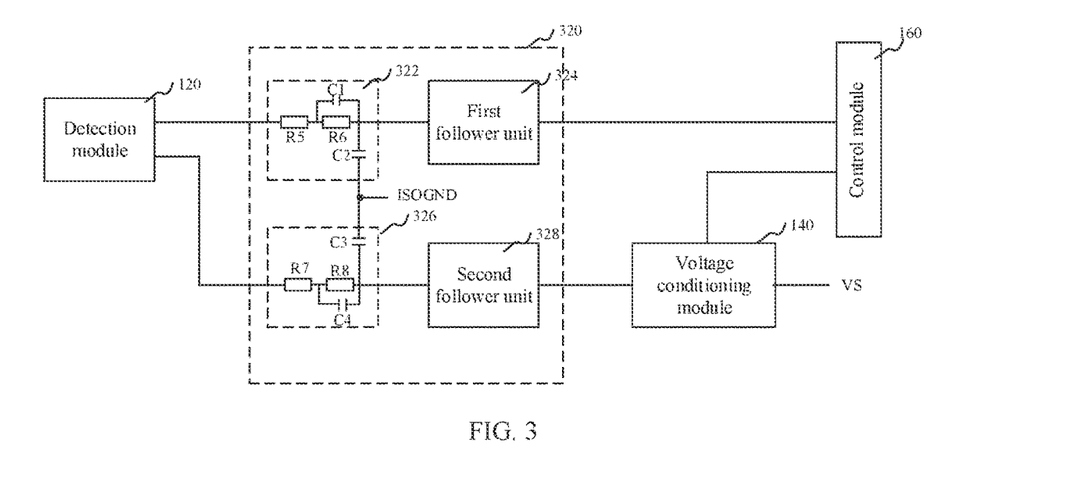
FIG. 3 is a schematic structure diagram of an insulation resistance detection device according to an embodiment II.

Referring to FIG. 3, which shows an insulation resistance detection device according to an embodiment II of the present disclosure. The insulation resistance detection device may include a detection module 120, a filter follower module 320, a voltage conditioning module 140, and a control module 160. For the description of the detection module 120, the voltage conditioning module 140, and the control module 160, reference can be made to the above embodiments, which will not be repeated here. The filter follower module 320 is configured to filter the first voltage and/or the second voltage outputted by the detection module 120, and isolate the detection module 120 from the voltage conditioning module 140 and/or isolate the detection module 120 from the control module 160.

The filter follower module 320 can include a first filter unit 322 and a first follower unit 324. The first filter unit 322 is connected to the detection module 120 to acquire the first voltage; and the first follower unit 324 is connected to the first filter unit 322 and the control module 160 respectively. It should be noted that the first filter unit 322 can be configured to filter a power frequency voltage interference and a high frequency voltage interference of the first voltage. The first follower unit 324 can be configured to isolate the detection module 120 from the control module 160. Referring to FIG. 3, the first filter unit 322 may include a resistor R5, a resistor R6, a capacitor C1, and a capacitor C2. Specifically, a first end of the resistor R5 is connected to the detection module 120; a second end of the resistor R5 is connected to a first end of the resistor R6; and a second end of the resistor R6 is connected to a first end of the capacitor C2 and the first follower unit 324 respectively; a second end of the capacitor C2 is connected to the first reference ground, and the capacitor C1 is connected in parallel with the resistor R6.

The filter follower module 320 may further include a second filter unit 326 and a second follower unit 328. The second filter unit 326 is connected to the detection module 120 to acquire the second voltage; and the second follower unit 328 is connected to the second filter unit 326 and the second end of the first voltage dividing unit of the voltage conditioning module 140 respectively. It should be noted that the second filter unit 326 can be configured to filter the power frequency voltage interference and the high frequency voltage interference of the second voltage. The second follower unit 328 can be configured to isolate the detection module 120 from the voltage conditioning module 140. Referring to FIG. 3, the second filter unit 326 may include a resistor R7, a resistor R8, a capacitor C3, and a capacitor C4. Specifically, a first end of the resistor R7 is connected to the detection module 120; a second end of the resistor R7 is connected to a first end of the resistor R8; and a second end of the resistor R8 is connected to the first end of the capacitor C3 and the second follower unit 328 respectively; the second end of the capacitor C3 is connected to the first reference ground; and the capacitor C4 is connected in parallel with the resistor R8.

Figure 4:
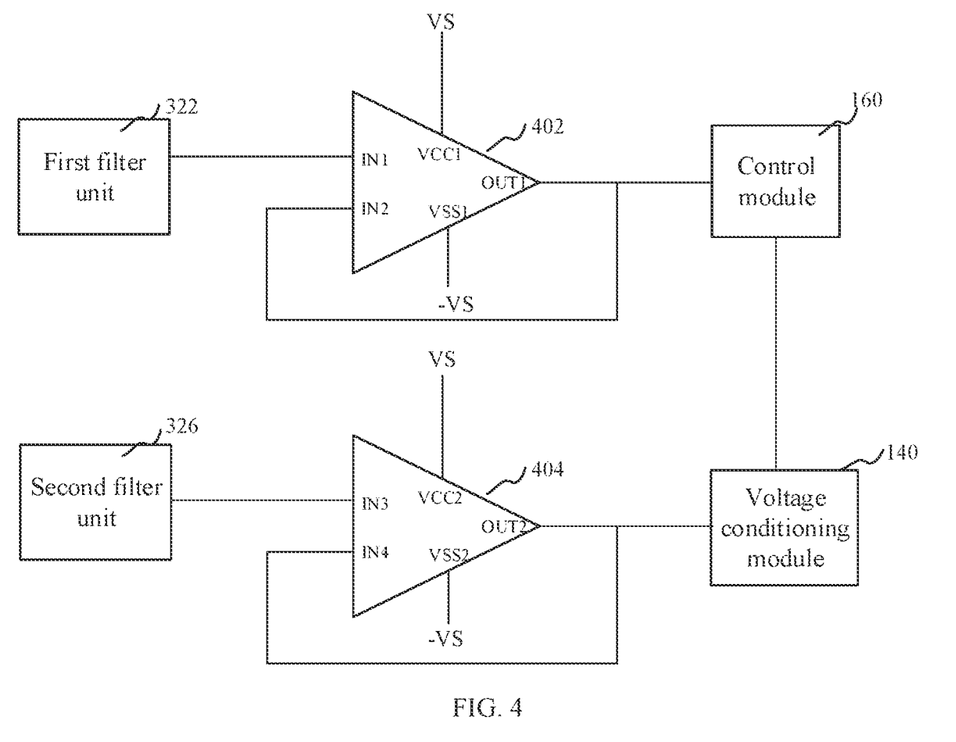
FIG. 4 is a schematic structure diagram of a filter follower module according to an embodiment.

Referring to FIG. 4, which shows a filter follower module according to an embodiment of the present disclosure. The filter follower module may include a first filter unit 322, a first follower unit, a second filter unit 326, and a second follower unit. As shown in FIG. 4, the first follower unit may include a first operational amplifier 402. The first operational amplifier 402 includes a positive phase input end IN1, a negative phase input end IN2, a positive power supply end VCC1, a negative power supply end VSS1, and an output end. OUT1. Specifically, the positive phase input end IN1 of the first operational amplifier is connected to the first filter unit 322; the negative phase input end IN2 of the first operational amplifier is connected to the output end OUT1 of the first operational amplifier; and the output end OUT1 of the first operational amplifier is connected to the control module 160; the positive power supply end VCC1 of the first operational amplifier is connected to the reference voltage VS; and the negative power supply end VSS1 of the first operational amplifier is connected to the negative reference voltage −VS. It should be noted that the negative reference voltage and the reference voltage are equal in magnitude but opposite in direction. The operational amplifier has the characteristics of high input impedance and low output impedance. In the embodiment of the present disclosure, the first operational amplifier 402 is used as the first follower unit, which can match the impedance of the interface between the detection module and the control module 160, and thereby improving the accuracy of voltage acquisition.

Referring to FIG. 4, in an embodiment of the present disclosure, the second follower unit may include a second operational amplifier 404. The second operational amplifier 404 includes a positive phase input end IN3, a negative phase input end IN4, a positive power supply end VCC2, a negative power supply end VSS2 and an output end OUT2. The positive phase input end IN3 of the second operational amplifier is connected to the second filter unit 326; the negative phase input end IN4 of the second operational amplifier is connected to the output end OUT2 of the second operational amplifier; and the output end OUT2 of the second operational amplifier is connected to the second end of the first voltage dividing unit 140 of the voltage conditioning module 140; the positive power supply end VCC2 of the second operational amplifier is connected to the reference voltage; the negative power supply end VSS2 of the second operational amplifier is connected to the negative reference voltage. In the embodiment of the present disclosure, the second operational amplifier 404 is used as the second follower unit, which can match the impedance of the interface between the detection module and the control module 160, and thereby improving the accuracy of voltage acquisition.

Figure 5:
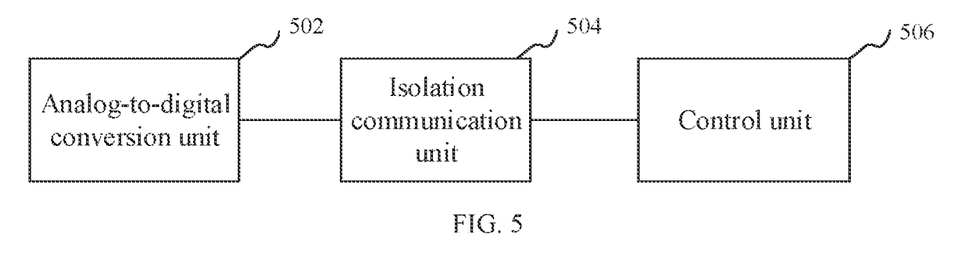
FIG. 5 is a schematic structure diagram of a control module according to an embodiment.

Referring to FIG. 5, which shows a control module according to an embodiment of the present disclosure. The control module may include an analog-to-digital conversion unit 502, an isolation communication unit 504, and a control unit 506. Specifically, the analog-to-digital conversion unit 502 is connected to the sampling module and the first end of the first voltage dividing unit respectively, and is configured to convert the first voltage into a first digital signal and convert the third voltage into a second digital signal. The isolation communication unit 504 is connected to the analog-to-digital conversion unit 502 and is configured to isolate the analog-to-digital conversion unit 502 from the control unit 506. The control unit 506 is connected to the isolation communication unit 504, and is further configured to acquire the first digital signal and the second digital signal, and calculate the first insulation resistance of the positive electrode of the battery to be detected with respect to the first reference ground and the second insulation resistance of the negative electrode of the battery to be detected with respect to the first reference ground according to the first digital signal and the second digital signal. Optionally, the control unit 506 may be a smallest system of a single-chip microcomputer (MCU). In the embodiment of the present disclosure, the isolation communication unit 502 is provided behind the analog-to-digital conversion unit 502, and is configured to implement an isolation transmission through the digital isolation communication. Compared to the isolation transmission implemented through the analog isolation communication, the cost is greatly reduced.

Figure 6:
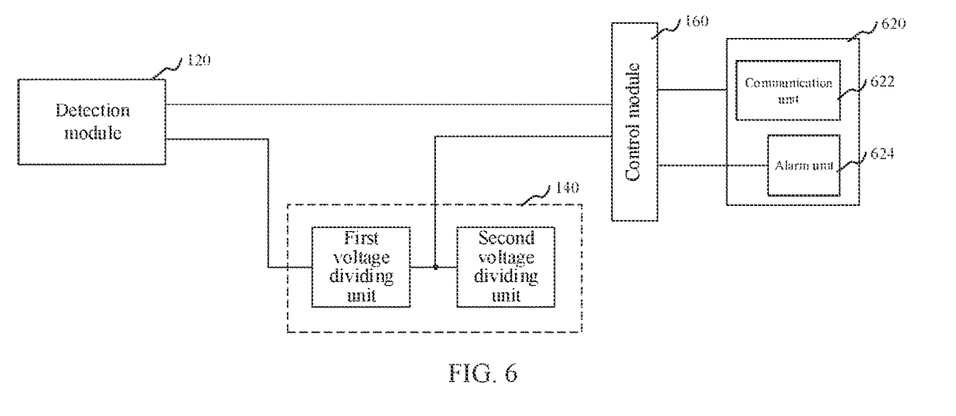
FIG. 6 is a schematic structure diagram of an insulation resistance detection device according to an embodiment III.

Referring to FIG. 6, which shows an insulation resistance output device according to an embodiment of the present disclosure. The insulation resistance output device includes a detection module 120, a voltage conditioning module 140, a control module 160, and an alarm module 620.

The description of the detection module 120, the voltage conditioning module 140, and the control module 160 is detailed in the above embodiments, and will not be repeated here. It should be noted that the control module 160 may further be configured to output corresponding alarm information according to the first insulation resistance, the second insulation resistance, and a threshold insulation resistance. The threshold insulation resistance is configured to measure whether the leakage state of the battery to be detected meets a safety requirement. It is understandable that those skilled in the art can set the threshold insulation resistance according to the actual situation. Optionally, the control module 160 includes a memory for storing the threshold insulation resistance. When the battery is detected, the first insulation resistance and the second insulation resistance are respectively compared to the threshold insulation resistance to determine whether the battery to be detected meets the requirement. If the first insulation resistance and/or the second insulation resistance are less than the threshold insulation resistance, corresponding alarm information is outputted.

The alarm module 620 is connected to the control module 160, and is configured to receive the alarm information outputted by the control module 160 and perform an alarm operation corresponding to the alarm information. Referring to FIG. 6, the alarm module 620 may include a communication unit 622 and an alarm unit 624. The communication unit 622 is connected to the control module 160, and is configured to transmit the alarm information to the terminal device for analysis by the monitoring personnel. It should be noted that the alarm information transmitted to the terminal device may include, but is not limited to, the first insulation resistance and the second insulation resistance. The alarm unit 624 is connected to the control module 160, and is configured to give an alarm through vibration, light and/or sound under the control of the control module 160. Optionally, the alarm unit 624 may include one or more of a vibration device, an LED light, and a buzzer.

Figure 7:
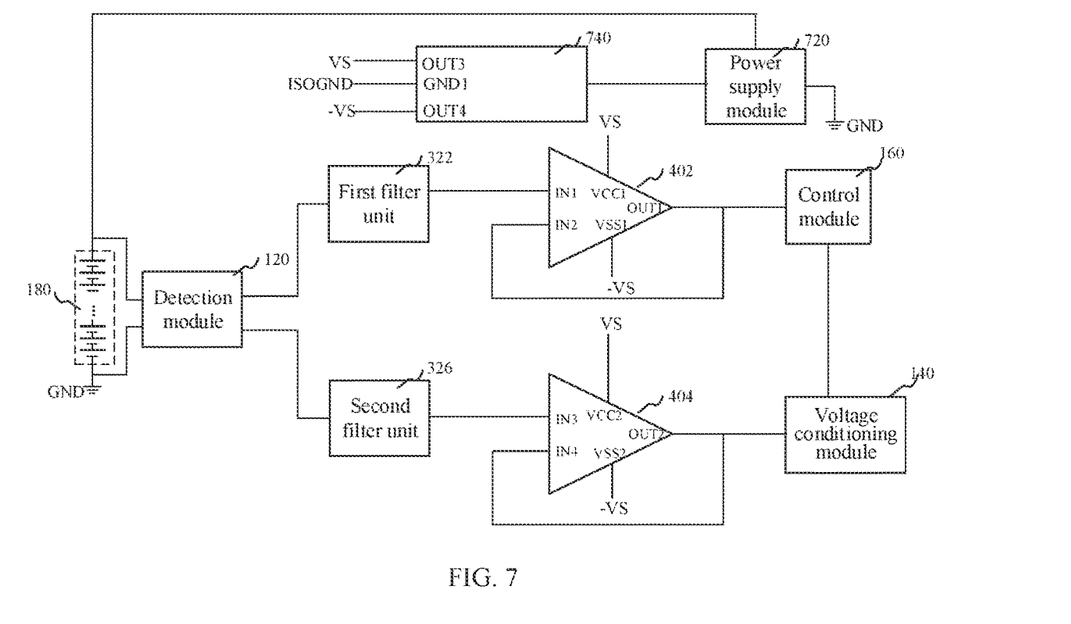
FIG. 7 is a schematic structure diagram of an insulation resistance detection device according to an embodiment IV.

Referring to FIG. 7, which shows an insulation resistance detection device according to an embodiment IV of the present disclosure. The insulation resistance detection device may include a detection module 120, a voltage conditioning module 140, a control module 160, a first filter unit 322, a first operational amplifier 402, a second filter unit 326, a second operational amplifier 404, a power supply module 720, and an isolation power supply module 740.

With regard to the detection module 120, the voltage conditioning module 140, the control module 160, the first filter unit 322, the first operational amplifier 402, the second filter unit 326, and the second operational amplifier 404, reference can be made to the above embodiments, which will not be described here. It should be noted that the negative electrode of the battery 180 to be detected is connected to the second reference ground GND; the ground end of the power supply module 720 is connected to the second reference ground; and the power supply module 720 is connected to the positive electrode of the battery 180 to be detected to adjust the voltage of the battery 180 to be detected to the fifth voltage. The isolation power supply module 740 is respectively connected to the power supply module 720, the positive power supply end VCC2 of the second operational amplifier, and the negative power supply end VSS2 of the second operational amplifier. The ground end GND1 of the isolation power supply module is connected to the first reference ground ISOGND. The isolation power supply module 740 is configured to adjust the fifth voltage to the reference voltage VS and the negative reference voltage −VS. It should be noted that the isolation power supply module 740 is connected to the power supply module 720 to acquire the fifth voltage and adjust the fifth voltage to the reference voltage VS and the negative reference voltage −VS, and provide the reference voltage VS to the positive power supply end VCC2 of the second operational amplifier and provide the negative reference voltage −VS to the negative power supply end VSS2 of the second operational amplifier.

Optionally, the isolation power supply module 740 can also be respectively connected to the positive power supply end VCC1 and the negative power supply end VSS1 of the first operational amplifier, to provide the positive power supply end VCC1 of the first operational amplifier with the reference voltage VS and the negative power supply end VSS1 of the first operational amplifier with the negative reference voltage −VS.

Optionally, the isolation power supply module 740 includes a first output end OUT3 and a second output end OUT4. The isolation power supply module 740 outputs the reference voltage VS through the first output end OUT3 of the isolation power supply module; and the isolation power supply module 740 outputs the negative reference voltage through the second output end OUT4 of the isolation power supply module. The positive power supply end VCC2 of the second operational amplifier is connected to the first output end OUT3 of the isolation power supply module; and the negative power supply end VSS2 of the second operational amplifier is connected to the second output end OUT4 of the isolation power supply module. The positive power supply end VCC1 of the first operational amplifier is connected to the first output end OUT3 of the isolation power supply module; and the negative power supply end VSS1 of the first operational amplifier is connected to the second output end OUT4 of the isolation power supply module.

Optionally, the control module may further include a control unit. The insulation resistance detection device may further include an alarm module. The power supply module is respectively connected to the control unit and the alarm module to provide the control unit and the alarm module with the fifth voltage. The fifth voltage can be used as an operating voltage of the control unit and the alarm module.

Figure 8:
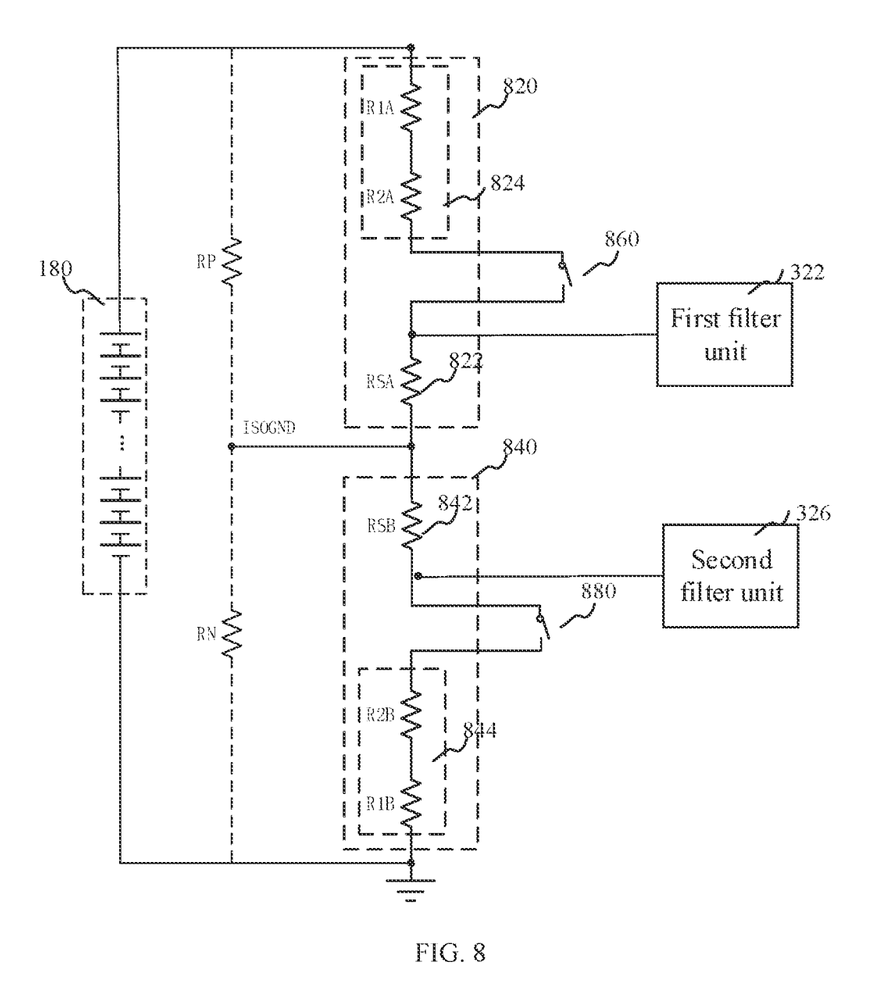
FIG. 8 is a schematic structure diagram of a sampling module according to an embodiment.

Referring to FIG. 8, which shows a sampling module according to an embodiment of the present disclosure. The sampling module may include a fifth voltage dividing unit 820, a sixth voltage dividing unit 840, a first switch unit 860, and a second switch unit 880. Specifically, the fifth voltage dividing unit 820 includes a first sampling resistor 822 and a first voltage dividing resistor 824. A first end of the first sampling resistor 822 is connected to the first reference ground ISOGND; and a second end of the first sampling resistor 822 is respectively connected to the first filter unit 322 and the first end of the first voltage dividing resistor 824; and the second end of the first voltage dividing resistor 824 is connected to the positive electrode of the battery 180 to be detected. The sixth voltage dividing unit 840 includes a second sampling resistor 842 and a second voltage dividing resistor 844. A first end of the second sampling resistor 842 is connected to the first reference ground ISOGND; and a second end of the second sampling resistor 842 is respectively connected to the second filter unit 326 and the first end of the second voltage dividing resistor 844; and the second end of the second voltage dividing resistor 844 is connected to the negative electrode of the battery 180 to be detected.

It can be understood that, in this embodiment, the fifth voltage dividing unit 820 is configured to divide the voltage of the positive electrode of the battery 180 to be detected with respect to the first reference ground ISOGND, and output the first voltage through the second end of the first sampling resistor 822. The sixth voltage dividing unit 840 is configured to divide the voltage of the negative electrode of the battery 180 to be detected with respect to the first reference ground ISOGND, and output the second voltage through the second end of the second sampling resistor 842. Optionally, as shown in FIG. 8, the first sampling resistor 822 includes a resistor RSA; and the first voltage dividing resistor 824 includes a resistor R1A and a resistor R2A connected in series with each other. Optionally, the second sampling resistor 842 includes a resistor RSB; and the second voltage dividing resistor 844 includes a resistor R1B and a resistor R2B connected in series with each other. It should be understood that resistance values of the first sampling resistor 822, the first voltage dividing resistor 824, the second sampling resistor 842, and the second voltage dividing resistor 844 and the number of resistors included therein are not limited in the embodiment of the present disclosure, which can be designed according to requirements.

A first switch unit 860 is configured to turn on or off a first power supply circuit. The first power supply circuit is a circuit formed by the fifth voltage dividing unit 820 and the battery 180 to be detected. A second switch unit 880 is configured to turn on or off a second power supply circuit. The second power supply circuit is a circuit formed by the sixth voltage dividing unit 840 and the battery 180 to be detected. It can be understood that when the insulation resistance detection device is in a non-detection state, the first switch unit 860 and the second switch unit 880 are in an off state, so that the battery 180 to be detected can be prevented from being in a leakage state. The control unit can also be configured to control the first switch unit 860 and the second switch unit 880 to turn off when the battery 180 to be detected needs to be detected. It can be understood that the control unit can control the first switch unit 860 and the second switch unit 880 to close at the same time, or at different time. The detecting personnel can set a time sequence of the turn-on and turn-off of the first switch unit 860 and the second switch unit 880 according to actual requirements, which is not limited in the embodiment of the present disclosure.

The first switch unit 860 can be a first optocoupler switch. Specifically, an input end of the first optocoupler switch is connected to the control module; a first output end and a second output end of the first optocoupler switch are connected in series in the first power supply circuit. The first optocoupler switch is configured to turn on or turn off the first output end and the second output end of the first optocoupler switch under the control of the control module. The second switch unit 880 can be a second optocoupler switch. Specifically, an input end of the second optocoupler switch is electrically connected to the control module. A first output end and a second output end of the second optocoupler switch are connected in series in the second power supply circuit. The second optocoupler switch is configured to turn on or off the first output end and the second output end of the second optocoupler switch under the control of the control module.

In this application, the first optocoupler switch and the second optocoupler switch can isolate the control module from the detection module, and thereby avoiding interference between the control module and the detection module due to electrical connections.

In the current forklift truck battery system, since the insulation resistance cannot be accurately measured due to the low system voltage and large power frequency voltage interference, the power system of the current forklift truck is usually not equipped with an insulation resistance detection system. However, the power system voltage of the current forklift truck is usually 24V, 48V, 72V and higher, but 48V, 72V and higher voltage platforms have exceeded a safe voltage range, the insulation resistance detection should be carried out to monitor the leakage status of the battery system in real time to reduce safety risks.

The insulation resistance detection device provided in any of the foregoing embodiments can be utilized to detect the leakage state of the forklift truck battery system to reduce safety risks. It should be noted that the battery to be detected in the foregoing embodiments is a forklift truck battery, and the first reference ground is a forklift truck body. Specifically, the detection module is configured to connect the forklift truck battery to detect the voltage of the positive electrode of the forklift truck battery with respect to the forklift truck body and output the corresponding first voltage, and is further configured to detect the voltage of the negative electrode of the forklift truck battery with respect to the forklift truck body and output the corresponding second voltage. The voltage conditioning module includes a first voltage dividing unit and a second voltage dividing unit. The first end of the first voltage dividing unit is connected to the first end of the second voltage dividing unit; and the second end of the first voltage dividing unit is connected to the detection module to acquire the second voltage; the second end of the second voltage dividing unit is configured to connect the reference voltage to make the third voltage be a positive voltage with respect to the forklift truck body. The third voltage is the voltage at the second end of the first voltage dividing unit. The control module is respectively connected to the sampling module and the second end of the first voltage dividing unit, to acquire the first voltage and the third voltage and calculate the first insulation resistance of the positive electrode of the forklift truck battery with respect to the forklift truck body and the second insulation resistance of the negative electrode of the forklift truck battery with respect to the forklift truck body according to the first voltage and the third voltage.

Figure 9:
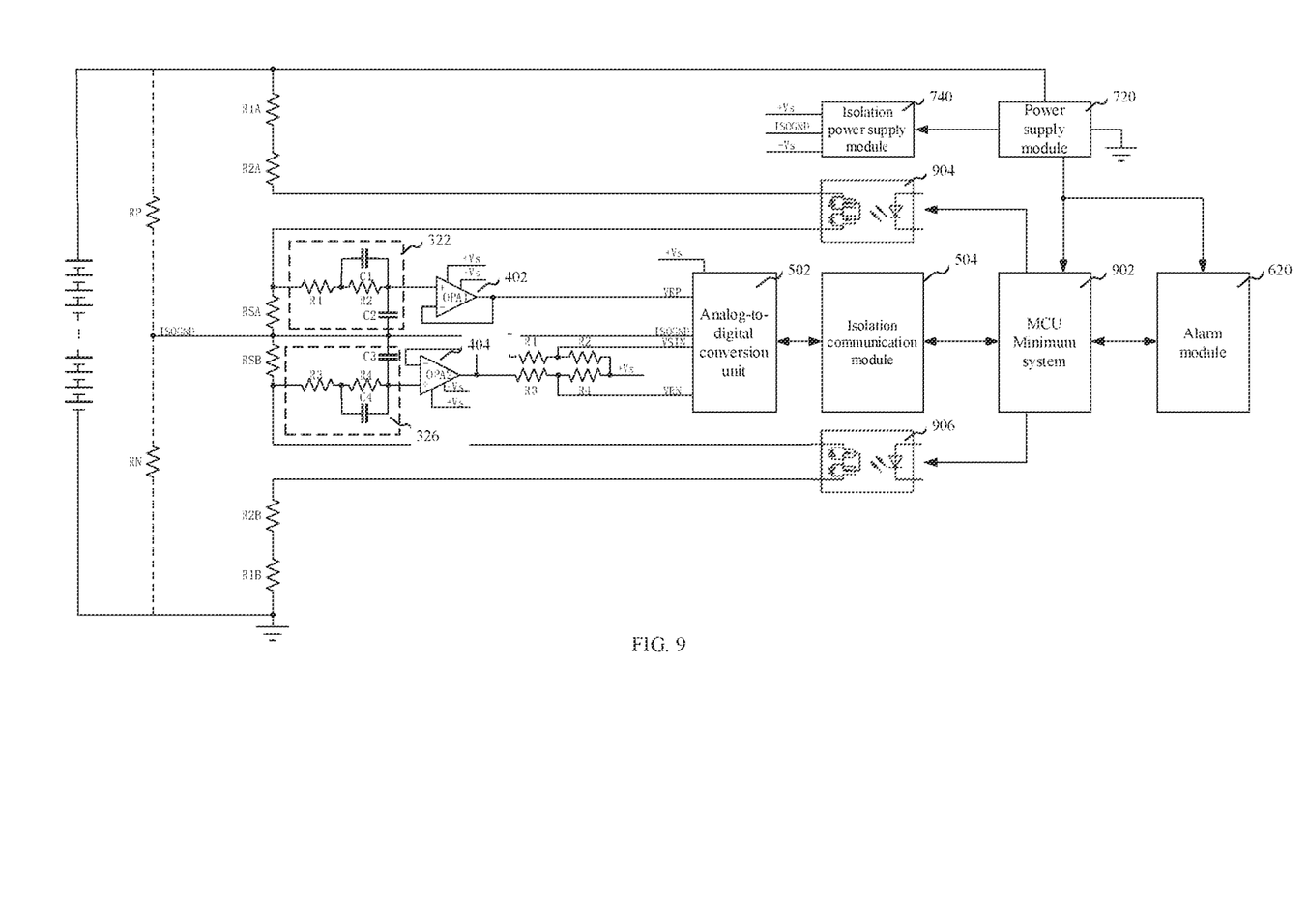
FIG. 9 is a schematic structure diagram of an insulation resistance detection device according to an embodiment V.

Referring to FIG. 9, which shows an insulation resistance detection device provided in an embodiment V of the present disclosure. The insulation resistance detection device includes a resistor RSA, a resistor R1A, a resistor R2A, a resistor RSB, a resistor R1B, a resistor R2B, a first filter unit 322, a second filter unit 326, a first operational amplifier 402, a second operational amplifier 404, a resistor R1, a resistor R2, a resistor R3, a resistor R4, an analog-to-digital conversion module 502, an isolation communication module 504, an MCU minimum system 902, an alarm module 620, an isolation power supply 740, a power supply module 720, a first optocoupler switch 904, and a second optocoupler switch 906.

Optionally, the MCU minimum system 902 controls the first optocoupler switch 904 to turn on and the second optocoupler switch 906 to turn off at a first moment; and after the signal is stabilize, the MCU minimum system 902 acquires the fourth voltage VSIN and the voltage VRP on the resistor RSA through the analog-to-digital conversion module 502. The MCU minimum system 902 controls the first optocoupler switch 904 to turn off and the second optocoupler switch 906 to turn on at a second moment; after the signal is stabilize, the MCU minimum system 902 acquires the fourth voltage VSIN and the third voltage VRN through the analog-to-digital conversion module 802.

It should be noted that when the first optocoupler switch 904 is turned on and the second optocoupler switch 906 is turned off, the first insulation resistor RP, the resistor R1A, the resistor R2A, the resistor RSA, the second insulation resistor RN and the forklift truck battery VBAT form a loop; the MCU minimum system 902 obtains the voltage of the resistor RSA as VRP, then there is an equation as follows:

$$\left[\frac{\frac{VRP}{RSA}(R1A+R2A+RSA)}{RP}+\frac{VRP}{RSA}\right]\cdot RN +$$
$$\frac{VRP}{RSA}\cdot(R1A+R2A+RSA) = VBAT.$$

When the first optocoupler switch 904 is turned off and the second optocoupler switch 906 is turned on, the first insulation resistor RP, the second insulation resistor RN, the resistor RSB, the resistor R1B, the resistor R2B and the forklift truck battery VBAT form a loop; and the MCU minimum system 902 obtains the voltage of the resistor RSB as VRSB, then there is an equation as follows:

$$\left[\frac{\frac{VRSB}{RSB}(R1B+R2B+RSB)}{RN}+\frac{VRSB}{RSB}\right]\cdot RP +$$
$$\frac{VRSB}{RSB}\cdot(R1B+R2B+RSB) = VBAT.$$

According to the voltage dividing theorem, an equation can be obtained as follows:

$$\frac{VS-VRN}{R8}=\frac{VRN-VRSB}{R7}.$$

According to the voltage dividing theorem, an equation can be obtained as follows:

$$VS = \frac{VSIN}{R5*(R5+R6)}.$$

The combination of the above four equations can solve the values of the first insulation resistor RP and the second insulation resistor RN.

Optionally, the resistance value of the resistor R7 is the same as that of the resistor R8; the resistance value of the resistor R1A is the same as that of the resistor R1B; the resistance value of the resistor R2A is the same as that of the resistor R2B; the resistance value of the resistor RSA is the same as that of the resistor RSB. Where R1A+R2A+RSA=R1B+R2B+RSB=RZ, and equations can be obtained as follows:

$$RP = \frac{VBAT \cdot (RS \cdot VBAT - RZ \cdot VRP) \cdot RS}{RZ \cdot (2VRN - VS) \cdot VRP + (RS \cdot VBAT - RZ \cdot VRP) \cdot (2VRN - VS)} - RZ$$

$$RN = \frac{(RS * VBAT - RZ * VRP) * RP}{(RZ + RP) * VRP};$$

where $VS = \frac{VSIN}{R5 * (R5 + R6)}.$

The insulation resistance detection device provided by the foregoing embodiments has a strong anti-interference ability of power frequency voltage and high frequency voltage, a wide application range, a high measurement accuracy, and a lower hardware cost. The insulation resistance detection device implements the fully isolated acquisition of the voltage of the positive electrode of the forklift truck battery with respect to the forklift truck body and the voltage of the negative electrode of the forklift truck battery with respect to the forklift truck body. The acquired analog signal passes through the first filter unit, the second filter unit, and the first operational amplifier and the second operational amplifier to filter out the power frequency interference and the high frequency interference; and the second voltage after the filtering process uses the resistor R1 and resistor R2 to replace the high-precision inverting amplifier circuit in order to reduce the hardware cost.

Figure 10:
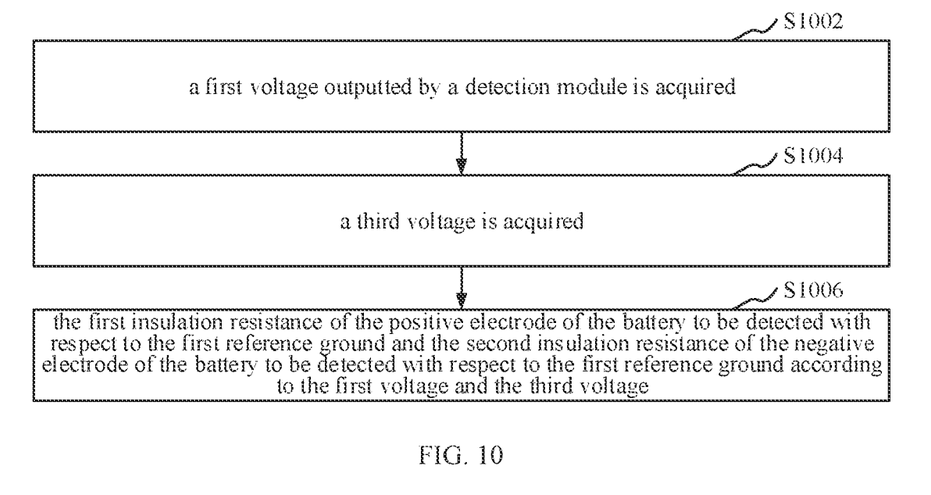
FIG. 10 is a flow chart showing an insulation resistance detection method according to an embodiment.

Referring to FIG. 10, which shows an insulation resistance detection method provided by an embodiment of the present disclosure. The method may include steps S1002 to S1006.

S1002: a first voltage outputted by a detection module is acquired.

The detection module is connected to the battery to be detected, and is configured to detect the voltage of the positive electrode of the battery to be detected with respect to the first reference ground and output the corresponding first voltage, and is further configured to detect the voltage of the negative electrode of the battery to be detected with respect to the first reference ground and output the corresponding second voltage.

S1004: a third voltage is acquired.

The third voltage is the voltage at the first end of the first voltage dividing unit in the voltage conditioning module. The voltage conditioning module includes the first voltage dividing unit and the second voltage dividing unit. The first end of the first voltage dividing unit is connected to the first end of the second voltage dividing unit; the second end of the first voltage dividing unit is connected to the detection module to acquire the second voltage; and the second end of the second voltage dividing unit is connected to the reference voltage to make the third voltage be a positive voltage with respect to the first reference ground.

S1006: the first insulation resistance of the positive electrode of the battery to be detected with respect to the first reference ground and the second insulation resistance of the negative electrode of the battery to be detected with respect to the first reference ground according to the first voltage and the third voltage.

It should be understood that although the various steps in the flow chart of FIG. 1 are displayed in sequence as indicated by the arrows, these steps are not definitely performed in sequence in the order indicated by the arrows. Unless there is a clear description in this article, there is no strict order for the execution of these steps, and these steps can be executed in other orders. Moreover, at least part of the steps in FIG. 1 may include multiple steps or multiple stages. These steps or stages are not definitely executed at the same time, but can be executed at different time; and the order of execution of these steps or stages is either not definitely performed sequentially, but may be performed in turns or alternately with other steps or at least a part of the steps or stages in other steps.

In an embodiment of the present disclosure, a forklift truck is provided and includes the insulation resistance detection device according to any of the above embodiments; the detection module is connected to a forklift truck battery.

In the description of the present disclosure, descriptions with reference to the terms "some embodiments", "other embodiments", "ideal embodiments", etc., mean that specific features, structures, materials, or characteristics described in conjunction with the embodiments or examples are included in at least one embodiment or example of the present disclosure. In this specification, the schematic description of the above-mentioned terms does not definitely refer to the same embodiment or example.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of the present disclosure.

The above-mentioned embodiments only express several exemplary embodiments of the present disclosure, and the descriptions are relatively specific and detailed, but they should not be interpreted as limiting the scope of the disclosure. It should be pointed out that those of ordinary skill in the art can make several modifications and improvements without departing from the concept of the present disclosure, and these all fall within the protection scope of the present disclosure. Therefore, the scope of protection of the present disclosure shall be subject to the appended claims.

What is claimed is:

1. An insulation resistance detection device, comprising:
   a detection module, configured to connect a battery to be detected, to detect a voltage of a positive electrode of the battery to be detected with respect to a first reference ground and output a corresponding first voltage, and detect a voltage of a negative electrode of the battery to be detected with respect to the first reference ground and output a corresponding second voltage;
   a voltage conditioning module, comprising a first voltage dividing unit and a second voltage dividing unit, wherein a first end of the first voltage dividing unit is connected to a first end of the second voltage dividing unit, a second end of the first voltage dividing unit is connected to the detection module to acquire the second voltage, and a second end of the second voltage dividing unit is configured to connect a reference voltage to make a third voltage be a positive voltage with respect to the first reference ground, wherein the third voltage is a voltage at the first end of the first voltage dividing unit;

a control module, respectively connected to a sampling module and the first end of the first voltage dividing unit, and configured to acquire the first voltage and the third voltage and calculate a first insulation resistance of the positive electrode of the battery to be detected with respect to the first reference ground and a second insulation resistance of the negative electrode of the battery to be detected with respect to the first reference ground according to the first voltage and the third voltage;

further comprising a filter follower module, wherein the filter follower module comprises a first filter unit and a first follower unit, the first filter unit is electrically connected to the sampling module to acquire the first voltage, and the first follower unit is respectively connected to the first filter unit and the control module; and/or the filter follower module further comprises a second filter unit and a second follower unit, the second filter unit is respectively connected to the sampling module to acquire the second voltage, and the second follower unit is respectively connected to the second filter unit and the second end of the first voltage dividing unit;

wherein the first follower unit comprises a first operational amplifier, and a positive phase input end of the first operational amplifier is connected to the first filter unit, a negative phase input end of the first operational amplifier is connected to an output end of the first operational amplifier, the output end of the first operational amplifier is connected to the control module, a positive power supply end of the first operational amplifier is configured to connect the reference voltage, a negative power supply end of the first operational amplifier is configured to connect a negative reference voltage, the negative reference voltage and the reference voltage are equal in magnitude but opposite in direction; and/or, the second follower unit comprises a second operational amplifier, a positive phase input end of the second operational amplifier is connected to the second filter unit, a negative phase input end of the second operational amplifier is connected to an output end of the second operational amplifier, the output end of the second operational amplifier is connected to the second end of the first voltage dividing unit, a positive power supply end of the second operational amplifier is configured to connect the reference voltage, a negative power supply end of the second operational amplifier is configured to connect the negative reference voltage.

2. The insulation resistance detection device according to claim 1, wherein the voltage conditioning module further comprises a third voltage dividing unit and a fourth voltage dividing unit, a first end of the third voltage dividing unit is connected to the first reference ground, a second end of the third voltage dividing unit is respectively connected to a first end of the fourth voltage dividing unit and the control module, a second end of the fourth voltage dividing unit is configured to connect the reference voltage;

the control module is connected to the second end of the third voltage dividing unit, and the control module is further configured to calculate the first insulation resistance of the positive electrode of the battery to be detected with respect to the first reference ground and the second insulation resistance of the negative electrode of the battery to be detected with respect to the first reference ground according to the first voltage, the third voltage, and a fourth voltage; wherein the fourth voltage is a voltage at the second end of the third voltage dividing unit.

3. The insulation resistance detection device according to claim 1, wherein the negative electrode of the battery to be detected is connected to a second reference ground, and the insulation resistance detection device further comprises:

a power supply module, connected to the positive electrode of the battery to be detected, wherein a ground end of the power supply module is configured to connect the second reference ground to adjust a voltage of the battery to be detected to a fifth voltage;

an isolation power supply module, respectively connected to the power supply module, the positive power supply end of the second operational amplifier, and the negative power supply end of the second operational amplifier, wherein a ground end of the isolation power supply module is configured to connect the first reference ground, the isolation power supply module is configured to adjust the fifth voltage to the reference voltage and a negative reference voltage.

4. The insulation resistance detection device according to claim 3, wherein the sampling module comprises:

a fifth voltage dividing unit, comprising a first sampling resistor and a first voltage dividing resistor, wherein a first end of the first sampling resistor is configured to connect the first reference ground, a second end of the first sampling resistor is respectively connected to the first filter unit and a first end of the first voltage dividing resistor, and a second end of the first voltage dividing resistor is configured to connect the positive electrode of the battery to be detected;

a sixth voltage dividing unit, comprising a second sampling resistor and a second voltage dividing resistor, wherein a first end of the second sampling resistor is configured to connect the first reference ground, a second end of the second sampling resistor is respectively connected to the second filter unit and a first end of the second voltage dividing resistor, a second end of the second voltage dividing resistor is configured to connect to the negative electrode of the battery to be detected;

a first switch unit, configured to turn on or turn off a first power supply circuit, wherein the first power supply circuit is a circuit formed by the fifth voltage dividing unit and the battery to be detected;

a second switch unit, configured to turn on or turn off a second power supply circuit, wherein the second power supply circuit is a circuit formed by the sixth voltage dividing unit and the battery to be detected.

5. The insulation resistance detection device according to claim 1, wherein the control module comprises:

an analog-to-digital conversion unit, respectively connected to the sampling module and the first end of the first voltage dividing unit, and configured to convert the first voltage into a first digital signal and the third voltage into a second digital signal;

an isolation communication unit, connected to the analog-to-digital conversion unit;

a control unit, connected to the isolation communication unit, and configured to acquire the first digital signal and the second digital signal and calculate the first insulation resistance of the positive electrode of the battery to de detected with respect to the first reference ground and the second insulation resistance of the negative electrode of the battery to be detected with respect to the first reference ground according to the first digital signal and the second digital signal.

6. The insulation resistance detection device according to claim 1, wherein the control module is further configured to output alarm information according to the first insulation resistance, the second insulation resistance and a threshold insulation resistance;

the insulation resistance detection device further comprises an alarm module connected to the control module and configured to receive the alarm information and perform an alarm operation corresponding to the alarm information.

7. The insulation resistance detection device according to claim 1, wherein the battery to be detected is a forklift truck battery, and the first reference ground is a forklift truck body.

8. A forklift truck, comprising the insulation resistance detection device according to claim 1, wherein the detection module is connected to a forklift truck battery.

* * * * *